(12) United States Patent
Li

(10) Patent No.: US 12,736,572 B2
(45) Date of Patent: Sep. 15, 2026

(54) TEST FIXTURE SET AND TESTING METHOD

(71) Applicant: Universal Scientific Industrial (Shanghai) Co., Ltd., Shanghai (CN)

(72) Inventor: Kuan Hsing Li, Shanghai (CN)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 275 days.

(21) Appl. No.: 18/624,137

(22) Filed: Apr. 2, 2024

(65) Prior Publication Data

US 2025/0093397 A1 Mar. 20, 2025

(30) Foreign Application Priority Data

Sep. 19, 2023 (CN) ......................... 202311212483.7

(51) Int. Cl.
*G01R 29/10* (2006.01)
*G01R 31/28* (2006.01)

(52) U.S. Cl.
CPC ......... *G01R 29/10* (2013.01); *G01R 31/2822* (2013.01)

(58) Field of Classification Search
CPC ............................ G01R 29/10; G01R 31/2822
See application file for complete search history.

(56) References Cited

U.S. PATENT DOCUMENTS

2016/0020817 A1* 1/2016 Chen ........................ H04B 1/48 370/278
2024/0061030 A1* 2/2024 Moreira ................. G01R 1/045

FOREIGN PATENT DOCUMENTS

CN 110024223 A 7/2019

* cited by examiner

*Primary Examiner* — Judy Nguyen
*Assistant Examiner* — Adam S Clarke
(74) *Attorney, Agent, or Firm* — CKC & Partners Co., LLC

(57) ABSTRACT

A test fixture set is configured for performing a test of a DUT (Device under Test). The DUT includes a DUT circuit board, a first DUT antenna and a second DUT antenna. The test fixture set includes a fixture circuit board, a first fixture antenna and a second fixture antenna. The fixture circuit board or the DUT circuit board further includes a circuit line. The test fixture set is configured for the first DUT antenna, the first fixture antenna, the second fixture antenna, the second DUT antenna and the circuit line to form a signal path for a RF (Radio Frequency) signal passing there-through.

9 Claims, 6 Drawing Sheets

TEST FIXTURE SET AND TESTING METHOD

RELATED APPLICATIONS

This application claims priority to China Application Serial Number 202311212483.7, filed Sep. 19, 2023, which is herein incorporated by reference.

BACKGROUND

Technical Field

The present disclosure relates to a test fixture set and a testing method. More particularly, the present disclosure relates to a test fixture set and a testing method applying in an antenna test.

Description of Related Art

Driven by human beings' pursuit of convenient life, various wireless communication systems and their RF (Radio Frequency) technologies have been developed, such as the rise of 5G mmWave (millimeter wave) technology in recent years. A common 5G mmWave module is in the type of AoP (Antenna on Package), and the antenna is assembled on the back side of the 5G mmWave module and has a metal patch pin as the excitation source. However, during the assembly process of SMT (Surface Mount Technology), there is a risk of poor soldering on the pins of the AoP antenna.

Therefore, how to effectively test and verify the AoP antenna, and how to detect the poor soldering of the pins thereof are important issues in today's market.

SUMMARY

According to one aspect of the present disclosure, a test fixture set is configured for performing a test of a DUT (Device under Test). The DUT includes a DUT circuit board, a first DUT antenna and a second DUT antenna. The DUT circuit board includes a DUT antenna surface. The first DUT antenna and the second DUT antenna are disposed on and electrically connected to the DUT antenna surface. The test fixture set includes a fixture circuit board, a first fixture antenna and a second fixture antenna. The fixture circuit board includes a fixture antenna surface, which has a normal direction and is configured to face the DUT antenna surface. The first fixture antenna is disposed on and electrically connected to the fixture antenna surface. The first fixture antenna is configured to be aligned with the first DUT antenna along the normal direction, and there is a spacing (gap, distance) between the first fixture antenna and the first DUT antenna. The second fixture antenna is disposed on and electrically connected to the fixture antenna surface. The second fixture antenna is configured to be aligned with the second DUT antenna along the normal direction, and there is another spacing between the second fixture antenna and the second DUT antenna. The fixture circuit board or the DUT circuit board further includes a circuit line. The test fixture set is configured for the first DUT antenna, the first fixture antenna, the second fixture antenna, the second DUT antenna and the circuit line to form a signal path for a RF (Radio Frequency) signal passing therethrough.

According to another aspect of the present disclosure, a testing method includes: providing a DUT, which includes a DUT circuit board, a first DUT antenna, a second DUT antenna and a RF controller, wherein the DUT circuit board includes a DUT antenna surface, the first DUT antenna and the second DUT antenna are disposed on and electrically connected to the DUT antenna surface, each of the first DUT antenna and the second DUT antenna is a dielectric resonator antenna and includes a first polarization pin and a second polarization pin, and the RF controller is disposed on and electrically connected to the DUT circuit board; providing a test fixture set, which includes a fixture circuit board, a first fixture antenna and a second fixture antenna, wherein the fixture circuit board includes a fixture antenna surface and a circuit line, the fixture antenna surface has a normal direction and is configured to face the DUT antenna surface, the first fixture antenna and the second fixture antenna are disposed on and electrically connected to the fixture antenna surface, each of the first fixture antenna and the second fixture antenna is a dielectric resonator antenna and includes a first polarization pin and a second polarization pin, two ends of the circuit line are electrically connected to the first polarization pin of the first fixture antenna and the second polarization pin of the second fixture antenna, respectively, the first fixture antenna and the first DUT antenna are aligned along the normal direction and have a spacing therebetween, and the second fixture antenna and the second DUT antenna are aligned along the normal direction and have another spacing therebetween; causing the RF controller to generate a RF signal and transmit the RF signal to the first polarization pin of the first DUT antenna; and causing a part of the RF signal to pass through the first polarization pin of the first DUT antenna, the first polarization pin of the first fixture antenna, the circuit line, the second polarization pin of the second fixture antenna and the second polarization pin of the second DUT antenna in sequence to the RF controller, and obtaining a first received signal parameter.

According to further another aspect of the present disclosure, a testing method includes: providing a DUT, which includes a DUT circuit board, a first DUT antenna and a second DUT antenna, wherein the DUT circuit board includes a DUT antenna surface and a circuit line, the first DUT antenna and the second DUT antenna are disposed on and electrically connected to the DUT antenna surface, each of the first DUT antenna and the second DUT antenna is a dielectric resonator antenna and includes a first polarization pin and a second polarization pin, and two ends of the circuit line are electrically connected to the first polarization pin of the first DUT antenna and the second polarization pin of the second DUT antenna, respectively; providing a test fixture set, which includes a fixture circuit board, a first fixture antenna, a second fixture antenna and at least one RF test equipment, wherein the fixture circuit board includes a fixture antenna surface having a normal direction and configured to face the DUT antenna surface, the first fixture antenna and the second fixture antenna are disposed on and electrically connected to the fixture antenna surface, each of the first fixture antenna and the second fixture antenna is a dielectric resonator antenna and includes a first polarization pin and a second polarization pin, the first fixture antenna and the first DUT antenna are aligned along the normal direction and have a spacing therebetween, the second fixture antenna and the second DUT antenna are aligned along the normal direction and have another spacing therebetween, and the at least one RF test equipment is electrically connected to the first polarization pin of the first fixture antenna and the second polarization pin of the second fixture antenna; causing the at least one RF test equipment to generate a RF signal and transmit the RF signal to the first polarization pin of the first fixture antenna; causing the RF signal to pass through the first polarization pin of the first fixture antenna, the first polarization pin of the first DUT antenna, the circuit line, the second polarization pin of the second DUT antenna and the second polarization pin of the second fixture antenna in sequence to the at least one RF test equipment, and obtaining a first received signal parameter; providing a first received signal standard range; comparing the first received signal parameter with the first received signal standard range; and determining whether at least one of the first polarization pin of the first DUT antenna and the second polarization pin of the second DUT antenna has a poor connection.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
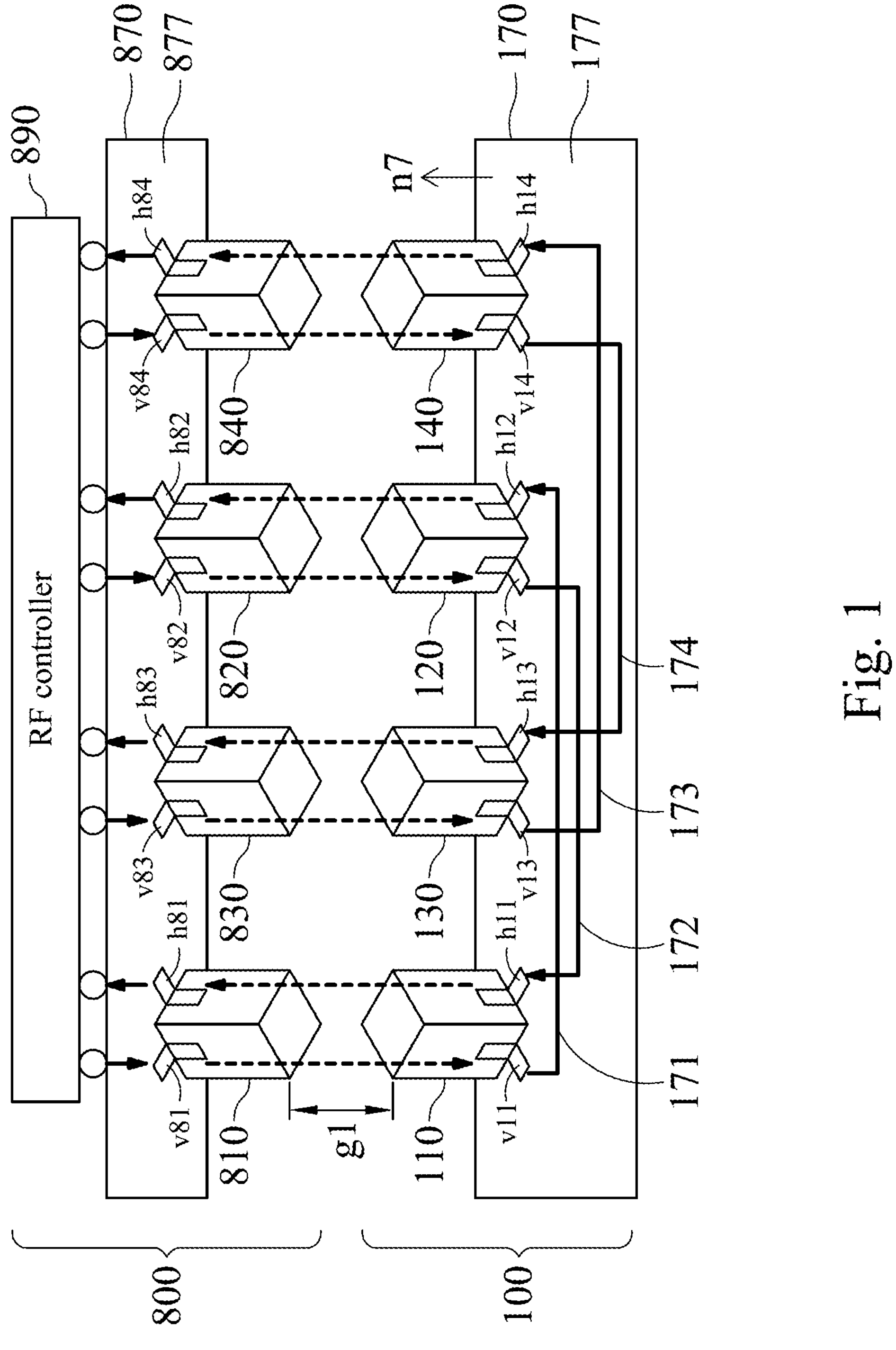
FIG. 1 is a schematic view of a usage status of a test fixture set according to the first embodiment of the present disclosure.

FIG. 1 is a schematic view of a usage status of a test fixture set 100 according to the first embodiment of the present disclosure. With reference to FIG. 1, the test fixture set 100 is configured for performing a test of a DUT (Device under Test) 800. The DUT 800 includes a DUT circuit board 870, a first DUT antenna 810 and a second DUT antenna 820. The DUT circuit board 870 includes a DUT antenna surface 877. The first DUT antenna 810 and the second DUT antenna 820 are disposed on and electrically connected to the DUT antenna surface 877. Specifically, the DUT 800 may be an mmWave AoP module. The DUT circuit board 870 is located on the back side of the DUT 800. Each of the first DUT antenna 810 and the second DUT antenna 820 may be an antenna element of an antenna array disposed on the DUT circuit board 870.

The test fixture set 100 includes a fixture circuit board 170, a first fixture antenna 110 and a second fixture antenna 120. The fixture circuit board 170 includes a fixture antenna surface 177, which has a normal direction n7 and is configured to face the DUT antenna surface 877, and it is noted that the drawing manner in FIG. 1 is only for clearly showing the pins of each antenna. The first fixture antenna 110 is disposed on and electrically connected to the fixture antenna surface 177. The first fixture antenna 110 is configured to be aligned with the first DUT antenna 810 along the normal direction n7, and there is a spacing g1 between the first fixture antenna 110 and the first DUT antenna 810. The second fixture antenna 120 is disposed on and electrically connected to the fixture antenna surface 177. The second fixture antenna 120 is configured to be aligned with the second DUT antenna 820 along the normal direction n7, there is another spacing between the second fixture antenna 120 and the second DUT antenna 820, and the value of the another spacing may be the same as the value of the spacing g1, so the another spacing is stated as the spacing g1 in the following.

The fixture circuit board 170 or the DUT circuit board 870 further includes a circuit line (conductive line), which may be disposed on the inner layer of the fixture circuit board 170 or the DUT circuit board 870. In the first embodiment, the fixture circuit board 170 further includes a circuit line 171.

The test fixture set 100 is configured for the first DUT antenna 810, the first fixture antenna 110, the second fixture antenna 120, the second DUT antenna 820 and the circuit line 171 to form a signal path for a RF (Radio Frequency) signal passing therethrough. Therefore, using the antenna element (e.g., the first fixture antenna 110 and the second fixture antenna 120) of the antenna array of the test fixture set 100 as part of the test loop (loopback) is beneficial to improve the coupling strength of the test signal. Further, it can be determined whether the first DUT antenna 810 and the second DUT antenna have abnormal characteristics based on the electrical characteristics of the signal path. For example, it can be evaluated whether the pins of the first DUT antenna 810 and the second DUT antenna 820 have phenomenon of poor soldering (poor welding, non-wetting, de-wetting, solder skip, solder empty, etc.), but the present disclosure is not limited thereto.

Specifically, the DUT 800 may further include a third DUT antenna 830 and a fourth DUT antenna 840, which are disposed on and electrically connected to the DUT antenna surface 877. The test fixture set 100 may further include a third fixture antenna 130 and a fourth fixture antenna 140, which are disposed on and electrically connected to the fixture antenna surface 177. The third fixture antenna 130 is configured to be aligned with the third DUT antenna 830 along the normal direction n7, and there is a spacing g1 between the third fixture antenna 130 and the third DUT antenna 830. The fourth fixture antenna 140 is configured to be aligned with the fourth DUT antenna 840 along the normal direction n7, and there is a spacing g1 between the fourth fixture antenna 140 and the fourth DUT antenna 840. The first fixture antenna 110, the third fixture antenna 130, the second fixture antenna 120 and the fourth fixture antenna 140 are arranged in sequence on the fixture antenna surface 177, so that the first DUT antenna 810, the third DUT antenna 830, the second DUT antenna 820 and the fourth DUT antenna 840 are arranged in sequence on the DUT antenna surface 877. Therefore, the signal transmission path of the test fixture set 100 is not between two adjacent antenna elements, so that it avoids the adjacent antenna elements being too close, thereby the mutual coupling energy being too strong, which is higher than or almost equal to the energy passing through the fixture circuit board 170, so as to lead to misjudgment of test results. According to the embodiments of the present disclosure, the antenna array on the DUT may be in the form of the antenna array with an even number of antenna elements, such as 1×4, 1×6, 1×8, etc., to form a loop and facilitate the design of the test fixture set and the overall test efficiency of the antenna array, and the number and arrangement of the antenna elements are not limited to the drawings of the present disclosure.

The first DUT antenna 810, the second DUT antenna 820, the third DUT antenna 830, the fourth DUT antenna 840, the first fixture antenna 110, the second fixture antenna 120, the third fixture antenna 130 and fourth fixture antenna 140 may be the same and have an operating frequency between 20 GHz and 100 GHz. The spacings g1 may be between 2 mm and 40 mm. Therefore, it is advantageous in achieving sufficient coupling strength between the fixture antennas and the DUT antennas. Furthermore, the spacings g1 may be between 3 mm and 20 mm.

Figure 2:
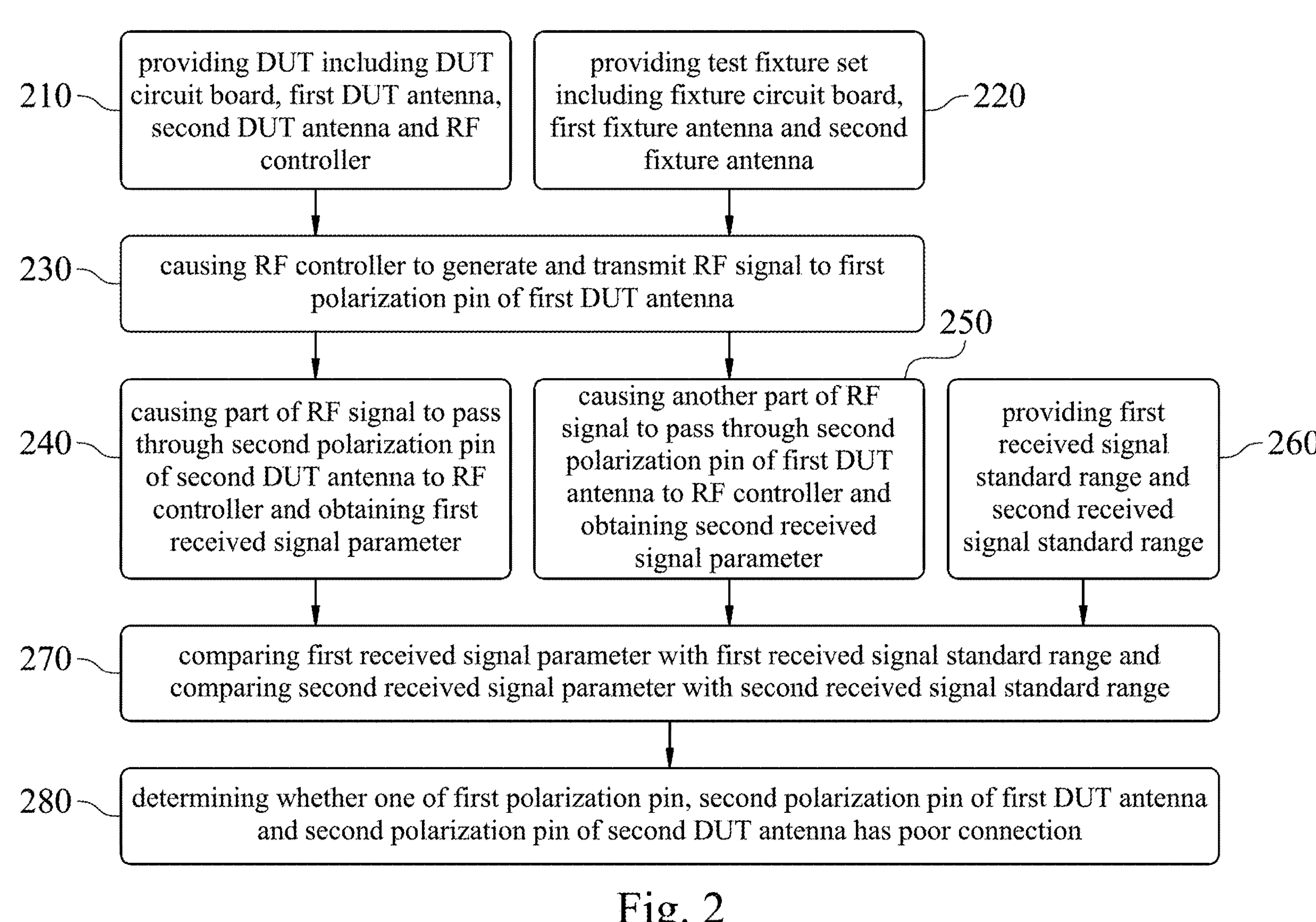
FIG. 2 is a flow chart of a testing method according to the second embodiment of the present disclosure.

FIG. 2 is a flow chart of a testing method 200 according to the second embodiment of the present disclosure. The test fixture set 100 of the first embodiment and the testing method 200 of the second embodiment of the present disclosure will be described together in the following. It should be noted that the test fixture set 100 is not limited to the application of the testing method 200, and the testing method 200 is not limited to the application of the test fixture set 100. With reference to FIG. 1 and FIG. 2, the testing method 200 includes steps 210, 220, 230, 240.

The step 210 includes providing the DUT 800, which further includes a RF controller 890, which is disposed on and electrically connected to the DUT circuit board 870. The RF controller 890 may specifically be an mmWave transceiver integrated circuit.

The step 220 includes providing the test fixture set 100, and the fixture circuit board 170 of the test fixture set 100 further includes the circuit line 171.

Furthermore, each of the first DUT antenna 810, the second DUT antenna 820, the first fixture antenna 110 and the second fixture antenna 120 may be a dual-port antenna, and specifically a dielectric resonator antenna (DRA) and includes a first polarization pin and a second polarization pin. The pins serve as antenna ports or excitation source pins. The pins may be in the form of conductive patches or conductive frames, and are not limited thereto. Therefore, it is beneficial to reduce loss in 5G mmWave frequency band (such as 71 GHz of Band n263) so as to improve the antenna efficiency and effective bandwidth. For the purpose of clear disclosure, the first polarization pin and the second polarization pin in the first and second embodiments are the vertical (vertical polarization) pin and the horizontal (horizontal polarization) pin, respectively. In other embodiment of the present disclosure (not shown in drawings), the first polarization pin and the second polarization pin may be the horizontal pin and the vertical pin, respectively.

Specifically, the first DUT antenna 810 includes a first DUT vertical pin v81 and a first DUT horizontal pin h81, the second DUT antenna 820 includes a second DUT vertical pin v82 and a second DUT horizontal pin h82, the first fixture antenna 110 includes a first fixture vertical pin v11 and a first fixture horizontal pin h11, and the second fixture antenna 120 includes a second fixture vertical pin v12 and a second fixture horizontal pin h12.

Furthermore, two ends of the circuit line 171 of the fixture circuit board 170 are electrically connected to the first fixture vertical pin v11 of the first fixture antenna 110 and the second fixture horizontal pin h12 of the second fixture antenna 120, respectively. The signal path is formed via the first DUT vertical pin v81, the first fixture vertical pin v11, the circuit line 171, the second fixture horizontal pin h12 and the second DUT horizontal pin h82 electrically coupled in sequence in a forward or reverse direction. Therefore, the signal coupling loop with a radiation manner can be formed via the test fixture set 100 including the circuit line 171. It should be noted that the term "connect" mentioned in the present disclosure means that two elements are in direct or indirect contact, and the term "electrical couple" mentioned in the present disclosure means that the two elements transfer electrical energy in direct or indirect contact or in a non-contact state.

The step 230 of the testing method 200 includes causing the RF controller 890 on the DUT circuit board 870 to generate a RF signal (e.g., an mmWave signal) and transmit the RF signal to the first DUT vertical pin v81.

The step 240 includes causing a part of the RF signal to pass through the aforementioned signal path. The part of the RF signal specifically passes through the first DUT vertical pin v81, the first fixture vertical pin v11, the circuit line 171, the second fixture horizontal pin h12 and the second DUT horizontal pin h82 in sequence to the RF controller 890, and a first received signal parameter (e.g., RSSI, but not limited thereto) is obtained. Specifically, the elements between the RF controller 890 and each DUT antenna are omitted in FIG. 1, and the generation and analysis of signals can be controlled by a program in a computer that is electrically connected to the RF controller 890. Therefore, the vertical polarization energy (or power) of the RF signal is generated via the first DUT antenna 810, and is coupled or radiated to first fixture vertical pin v11 on the lower side in FIG. 1 with the same polarization direction thereas to have higher coupling energy. Next, the RF signal is conducted to the second fixture horizontal pin h12 via the circuit line 171, and the energy is further coupled to the second DUT horizontal pin h82 on the upper side in FIG. 1 in the radiation manner. The RF signal is transmitted back to the RF controller 890 via the original circuit or the circuit designed for testing of the DUT circuit board 870. Moreover, since the characteristics of the test fixture set 100 have been confirmed to be normal before executing the testing method 200, it can be determined whether the signal path has abnormal characteristics through the received strength index obtained from the RF controller 890, e.g., evaluating accordingly whether the first DUT vertical pin v81 and the second DUT horizontal pin h82 having poor soldering.

The testing method 200 may further include steps 250, 260, 270, 280. The step 250 includes causing another part of the RF signal to pass through first DUT vertical pin v81 and the first DUT horizontal pin h81 in sequence to the RF controller 890 (not shown in drawings), and obtaining a second received signal parameter. Therefore, when the RF controller 890 transmits a RF signal to the first DUT vertical pin v81, the energy is also coupled to the first DUT horizontal pin h81 of the same antenna element. The RF signal is transmitted back to the RF controller 890 via the original circuit or the circuit designed for testing of the DUT circuit board 870. Moreover, it can be determined whether the signal path has abnormal characteristics through the received strength index obtained from the RF controller 890, e.g., evaluating accordingly whether the first DUT vertical pin v81 and the first DUT horizontal pin h81 having poor soldering.

The step 260 includes providing a first received signal standard range and a second received signal standard range, which can be obtained from previous test data or from test data of the same or similar test configuration.

The step 270 includes comparing the first received signal parameter with the first received signal standard range for determining the first received signal parameter being normal or not, and comparing the second received signal parameter with the second received signal standard range for determining the second received signal parameter being normal or not.

The step 280 includes, based on the determining results in the step 270, determining whether at least one of the first DUT vertical pin v81, the first DUT horizontal pin h81 of the first DUT antenna 810 and the second DUT horizontal pin h82 of the second DUT antenna 820 has or may have a poor connection. Therefore, for example, when the received strength index via the first DUT vertical pin v81 and the second DUT horizontal pin h82 in the step 240 is abnormal, and the received strength index via the first DUT vertical pin v81 and first DUT horizontal pin h81 in the step 250 is normal, it can be determined that the second DUT horizontal pin h82 has a poor connection. Accordingly, considering the mutual coupling characteristics of the vertical pins and horizontal pins of the same DUT antenna element (i.e., the step 250), the testing method 200 is advantageous in accurately detecting the antenna port, on which the solder joint having the poor connection is located.

Furthermore, the RF controller 890 on the DUT circuit board 870 is electrically connected to each of the first DUT vertical pin v81, the first DUT horizontal pin h81, the second DUT vertical pin v82 and the second DUT horizontal pin h82.

In the first and second embodiments, with reference to FIG. 1, the fixture circuit board 170 further includes a circuit line 172. Analogous to the aforementioned steps, the RF controller 890 is configured to generate a RF signal and transmit the RF signal to the second DUT vertical pin v82, a part of the RF signal passes through a signal path including the circuit line 172 and then passes through the first DUT horizontal pin h81 to the RF controller 890, and a first received signal parameter is obtained. Another part of the RF signal passes through the second DUT horizontal pin h82 to the RF controller 890 (not shown in drawings), and a second received signal parameter is obtained. Accordingly, it can be determined whether at least one of the second DUT vertical pin v82, the second DUT horizontal pin h82 and the first DUT horizontal pin h81 has or may have a poor connection.

In other embodiment of the present disclosure (not shown in drawings), analogous to the aforementioned steps, the RF controller 890 may be configured to generate a RF signal and transmit the RF signal to the first DUT horizontal pin h81, a part of the RF signal passes through a signal path including a circuit line of the fixture circuit board and then passes through the second DUT vertical pin v82 to the RF controller 890, and a first received signal parameter is obtained. Another part of the RF signal passes through the first DUT vertical pin v81 to the RF controller 890, and a second received signal parameter is obtained. Accordingly, it can be determined whether at least one of the first DUT vertical pin v81, the first DUT horizontal pin h81 and the second DUT vertical pin v82 has or may have a poor connection. Analogous to the aforementioned steps, the RF controller 890 may be configured to generate a RF signal and transmit the RF signal to the second DUT horizontal pin h82, a part of the RF signal passes through a signal path including a circuit line of the fixture circuit board and then passes through the first DUT vertical pin v81 to the RF controller 890, and a first received signal parameter is obtained. Another part of the RF signal passes through the second DUT vertical pin v82 to the RF controller 890, and a second received signal parameter is obtained. Accordingly, it can be determined whether at least one of the second DUT vertical pin v82, the second DUT horizontal pin h82 and the first DUT vertical pin v81 has or may have a poor connection.

With reference to FIG. 1, in the first and second embodiments, the third DUT antenna 830 includes a vertical pin v83 and a horizontal pin h83, the fourth DUT antenna 840 includes a vertical pin v84 and a horizontal pin h84, the third fixture antenna 130 includes a vertical pin v13 and a horizontal pin h13, and the fourth fixture antenna 140 includes a vertical pin v14 and a horizontal pin h14. The fixture circuit board 170 further includes circuit lines 173, 174. Analogous to the aforementioned steps, it can be determined whether at least one of the vertical pins v83, v84 and the horizontal pins h83, h84 has or may have a poor connection, so that the test fixture set 100 and the testing method 200 can be applied in automated testing in mass production, and the details thereof will not be described herein.

Figure 3:
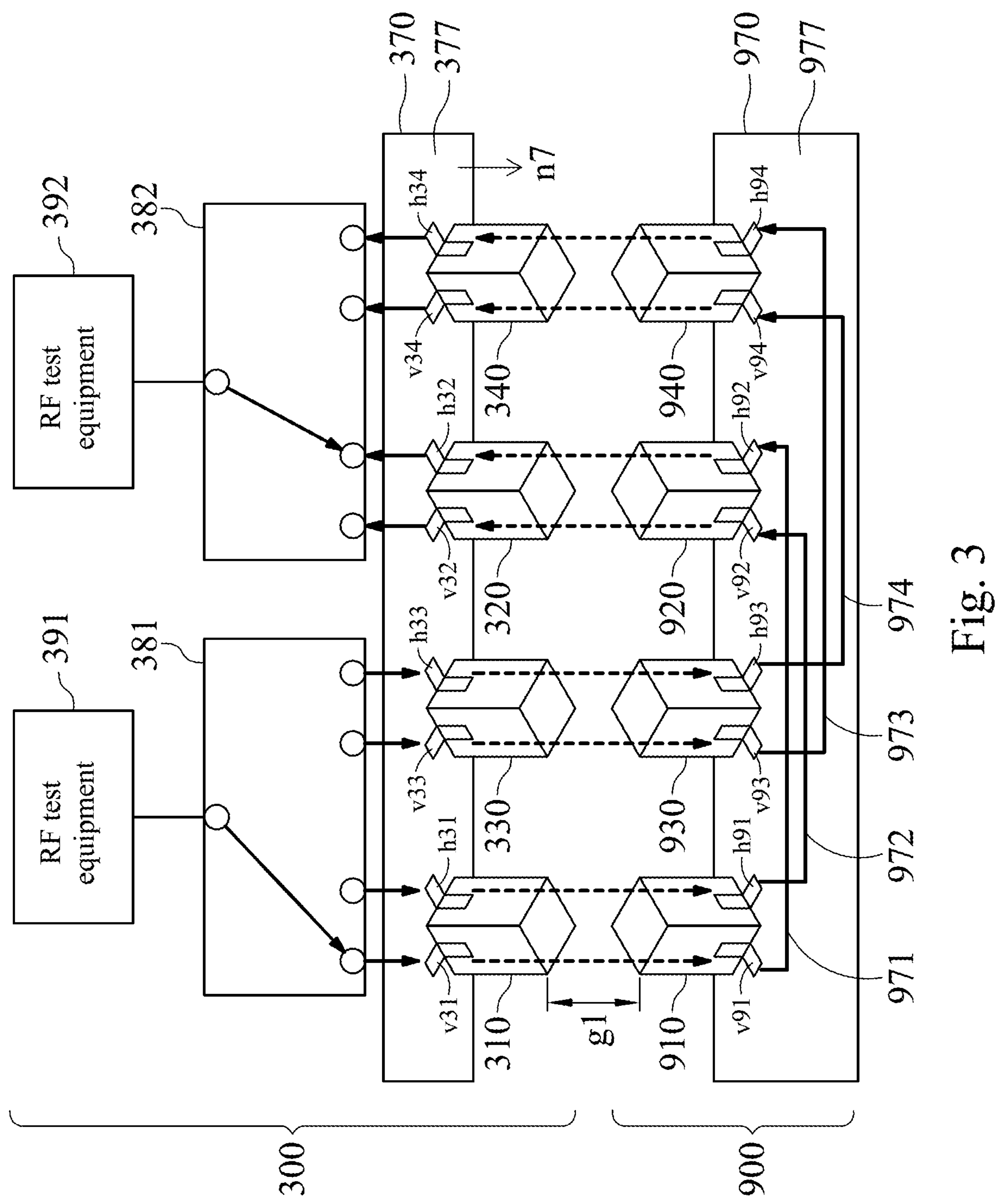
FIG. 3 is a schematic view of a usage status of a test fixture set according to the third embodiment of the present disclosure.

FIG. 3 is a schematic view of a usage status of a test fixture set 300 according to the third embodiment of the present disclosure. With reference to FIG. 3, the test fixture set 300 is configured for performing a test of a DUT 900. The DUT 900 includes a DUT circuit board 970, a first DUT antenna 910 and a second DUT antenna 920. The DUT circuit board 970 includes a DUT antenna surface 977. The first DUT antenna 910 and the second DUT antenna 920 are disposed on and electrically connected to the DUT antenna surface 977.

The test fixture set 300 includes a fixture circuit board 370, a first fixture antenna 310 and a second fixture antenna 320. The fixture circuit board 370 includes a fixture antenna surface 377, which has a normal direction n7 and is configured to face the DUT antenna surface 977. The first fixture antenna 310 is disposed on and electrically connected to the fixture antenna surface 377. The first fixture antenna 310 is configured to be aligned with the first DUT antenna 910 along the normal direction n7, and there is a spacing g1 between the first fixture antenna 310 and the first DUT antenna 910. The second fixture antenna 320 is disposed on and electrically connected to the fixture antenna surface 377. The second fixture antenna 320 is configured to be aligned with the second DUT antenna 920 along the normal direction n7, and there is a spacing g1 between the second fixture antenna 320 and the second DUT antenna 920.

Specifically, the DUT 900 further includes a third DUT antenna 930 and a fourth DUT antenna 940, which are disposed on and electrically connected to the DUT antenna surface 977. The test fixture set 300 further includes a third fixture antenna 330 and a fourth fixture antenna 340, which are disposed on and electrically connected to the fixture antenna surface 377. The third fixture antenna 330 is configured to be aligned with the third DUT antenna 930 along the normal direction n7, and there is a spacing g1 between the third fixture antenna 330 and the third DUT antenna 930. The fourth fixture antenna 340 is configured to be aligned with the fourth DUT antenna 940 along the normal direction n7, and there is a spacing g1 between the fourth fixture antenna 340 and the fourth DUT antenna 940. The first fixture antenna 310, the third fixture antenna 330, the second fixture antenna 320 and the fourth fixture antenna 340 are arranged in sequence on the fixture antenna surface 377, so that the first DUT antenna 910, the third DUT antenna 930, the second DUT antenna 920 and the fourth DUT antenna 940 are arranged in sequence on the DUT antenna surface 977.

The first DUT antenna 910, the second DUT antenna 920, the third DUT antenna 930, the fourth DUT antenna 940, the first fixture antenna 310, the second fixture antenna 320, the third fixture antenna 330 and fourth fixture antenna 340 are the same and have an operating frequency between 20 GHz and 100 GHz. The spacings g1 are between 2 mm and 40 mm and specifically 30 mm.

Figure 4:
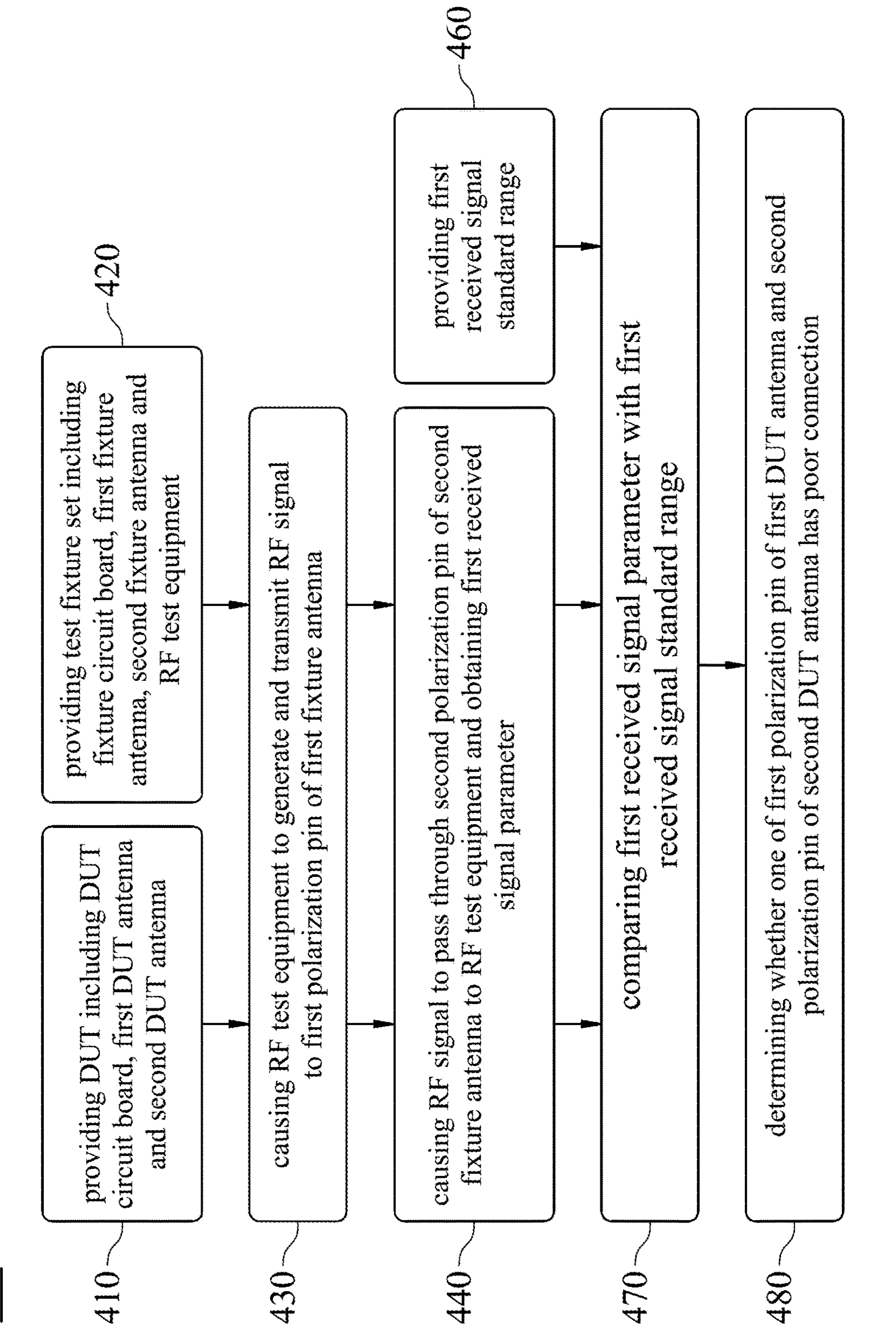
FIG. 4 is a flow chart of a testing method according to the fourth embodiment of the present disclosure.

FIG. 4 is a flow chart of a testing method 400 according to the fourth embodiment of the present disclosure. The test fixture set 300 of the third embodiment and the testing method 400 of the fourth embodiment of the present disclosure will be described together in the following. It should be noted that the test fixture set 300 is not limited to the application of the testing method 400, and the testing method 400 is not limited to the application of the test fixture set 300. With reference to FIG. 3 and FIG. 4, the testing method 400 includes steps 410, 420, 430, 440.

The step 410 includes providing the DUT 900, the DUT circuit board 970 of the DUT 900 further includes a circuit line 971. Furthermore, the DUT circuit board 970 may be a daisy chain board, which may be used to form a loop via antenna radiation coupling, thereby is beneficial to detect whether the antenna pins have abnormal solder joints.

The step 420 includes providing the test fixture set (test fixture system) 300, which further includes RF test equipments 391, 392 and switches 381, 382. Specifically, the RF test equipments 391, 392 are a signal generator and a power meter, respectively, and each of the switches 381, 382 is an SP4T RF switch. The RF testing equipment 391 is electrically connected to the first fixture antenna 310 via switching by the switch 381, and the RF testing equipment 392 is electrically connected to the second fixture antenna 320 via switching by the switch 382.

Furthermore, each of the first DUT antenna 910, the second DUT antenna 920, the first fixture antenna 310 and the second fixture antenna 320 is a dielectric resonator antenna. Specifically, the first DUT antenna 910 includes a first DUT vertical pin v91 and a first DUT horizontal pin h91, the second DUT antenna 920 includes a second DUT vertical pin v92 and a second DUT horizontal pin h92, the first fixture antenna 310 includes a first fixture vertical pin v31 and a first fixture horizontal pin h31, and the second fixture antenna 320 includes a second fixture vertical pin v32 and a second fixture horizontal pin h32.

Two ends of the circuit line 971 are electrically connected to the first DUT vertical pin v91 of the first DUT antenna 910 and the second DUT horizontal pin h92 of the second DUT antenna 920, respectively. The signal path is formed via the first fixture vertical pin v31, the first DUT vertical pin v91, the circuit line 971, the second DUT horizontal pin h92 and the second fixture horizontal pin h32 electrically coupled in sequence in a forward or reverse direction. Therefore, the signal coupling loop with a radiation manner can be formed via the test fixture set 300 and the DUT circuit board 970 in the daisy chain type.

The step 430 of the testing method 400 includes causing the RF test equipment 391 to generate a RF signal and transmit the RF signal to the first fixture vertical pin v31 via the switch 381. The step 440 includes causing the RF signal to pass through the aforementioned signal path. The RF signal specifically passes through the first fixture vertical pin v31, the first DUT vertical pin v91, the circuit line 971, the second DUT horizontal pin h92, the second fixture horizontal pin h32 and the switch 382 in sequence to the RF test equipment 392, and a first received signal parameter (e.g., a received strength, but not limited thereto) is obtained.

The testing method 400 may further include steps 460, 470, 480. The step 460 includes providing a first received signal standard range. The step 470 includes comparing the first received signal parameter with the first received signal standard range. The step 480 includes determining whether at least one of the first DUT vertical pin v91 and the second DUT horizontal pin h92 has a poor connection. Therefore, it can be determined whether the signal path has abnormal characteristics through the received strength measured by the RF test equipment 392, e.g., evaluating accordingly whether the first DUT vertical pin v91 and the second DUT horizontal pin h92 having poor soldering.

Furthermore, the RF test equipment 391 is able to be electrically connected to each of the first fixture vertical pin v31 and the first fixture horizontal pin h31 via switching by the switch 381, and the RF test equipment 392 is able to be electrically connected to each of the second fixture vertical pin v32 and the second fixture horizontal pin h32 via switching by the switch 382.

In the third and fourth embodiments, with reference to FIG. 3, the DUT circuit board 970 further includes a circuit line 972. Analogous to the aforementioned steps, the RF test equipment 391 is configured to generate a RF signal and transmit the RF signal to the first fixture horizontal pin h31 via the switch 381, the RF signal passes through the signal path including the circuit line 972 and then passes through the second fixture vertical pin v32 and the switch 382 in sequence to the RF test equipment 392, and a first received strength is obtained. Accordingly, it can be determined whether at least one of the first DUT horizontal pin h91 and the second DUT vertical pin v92 has or may have a poor connection.

In other embodiment of the present disclosure (not shown in drawings), when the positions of the RF test equipment 391 (signal generator) and the RF test equipment 392 (power meter) in FIG. 3 are exchanged, analogous to the aforementioned steps, the RF test equipment 391 is configured to generate a RF signal and transmit the RF signal to the second fixture horizontal pin h32 via the switch 382, the RF signal passes through the signal path including the circuit line 971 and then passes through the first fixture vertical pin v31 and the switch 381 in sequence to the RF test equipment 392, and a first received strength is obtained. Accordingly, it can be determined whether at least one of the first DUT vertical pin v91 and the second DUT horizontal pin h92 has or may have a poor connection. Analogous to the aforementioned steps, the RF test equipment 391 is configured to generate a RF signal and transmit the RF signal to the second fixture vertical pin v32 via the switch 382, the RF signal passes through the signal path including the circuit line 972 and then passes through the first fixture horizontal pin h31 and the switch 381 in sequence to the RF test equipment 392, and a first received strength is obtained. Accordingly, it can be determined whether at least one of the first DUT horizontal pin h91 and the second DUT vertical pin v92 has or may have a poor connection.

With reference to FIG. 3, in the third and fourth embodiments, the third DUT antenna 930 includes a vertical pin v93 and a horizontal pin h93, the fourth DUT antenna 940 includes a vertical pin v94 and a horizontal pin h94, the third fixture antenna 330 includes a vertical pin v33 and a horizontal pin h33, and the fourth fixture antenna 340 includes a vertical pin v34 and a horizontal pin h34. The DUT circuit board 970 further includes circuit lines 973, 974. Analogous to the aforementioned steps, it can be determined whether at least one of the vertical pins v93, v94 and the horizontal pins h93, h94 has or may have a poor connection, and the details thereof will not be described herein.

Figure 5A:
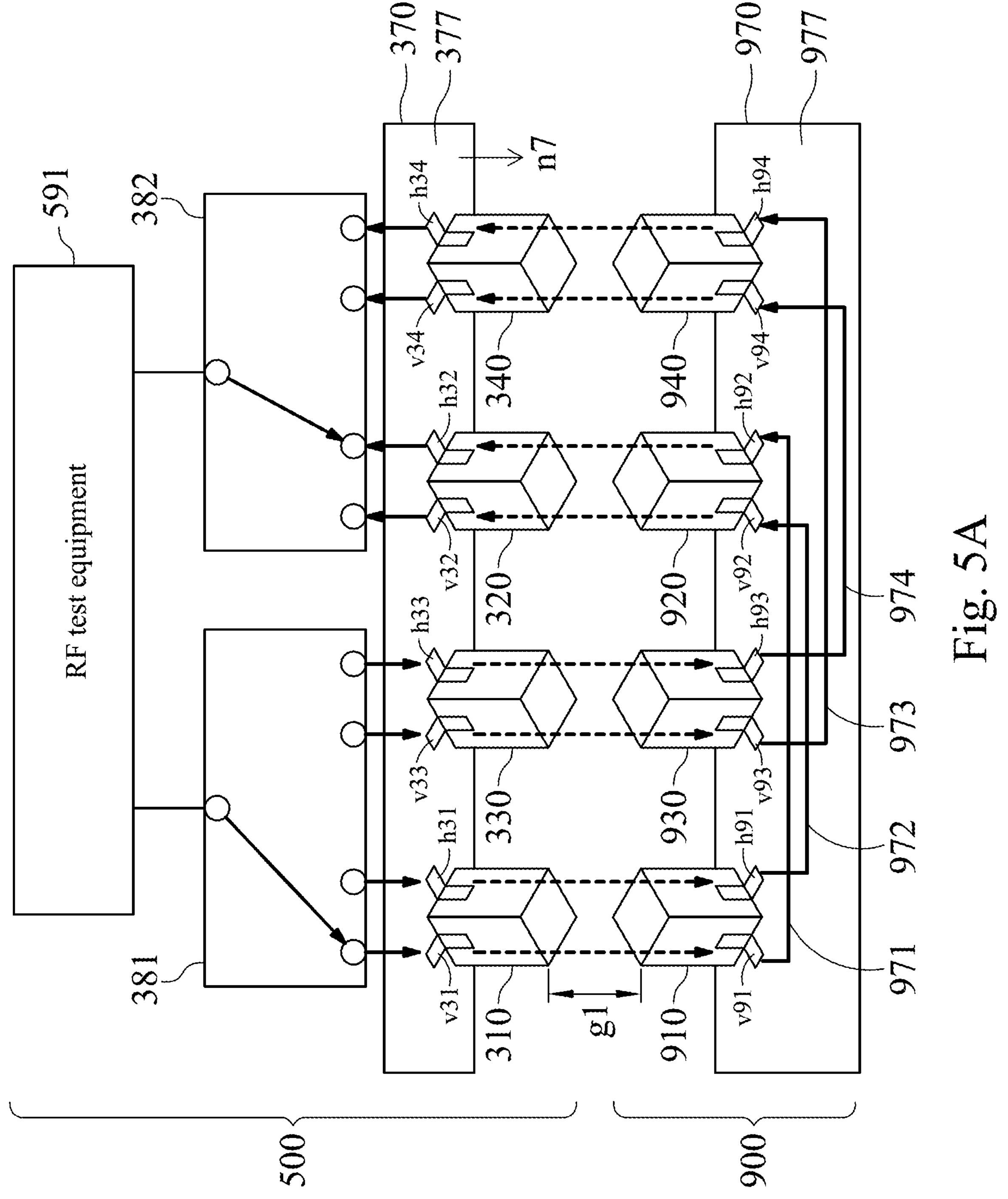
FIG. 5A is a schematic view of a usage status of a test fixture set according to the 5th embodiment of the present disclosure.

FIG. 5A is a schematic view of a usage status of a test fixture set 500 according to the 5th embodiment of the present disclosure. With reference to FIG. 3 and FIG. 5A, the only difference between the test fixture set 500 and the test fixture set 300 is that the RF test equipment 591 of the test fixture set 500 replaces the RF test equipments 391, 392 of the test fixture set 300. The RF test equipment 591 may be a vector network analyzer (VNA). The contents of the aforementioned third and fourth embodiments can be referred for the details of the test fixture set 500 of the fifth embodiment, and the details thereof will not be described herein.

Figure 5B:
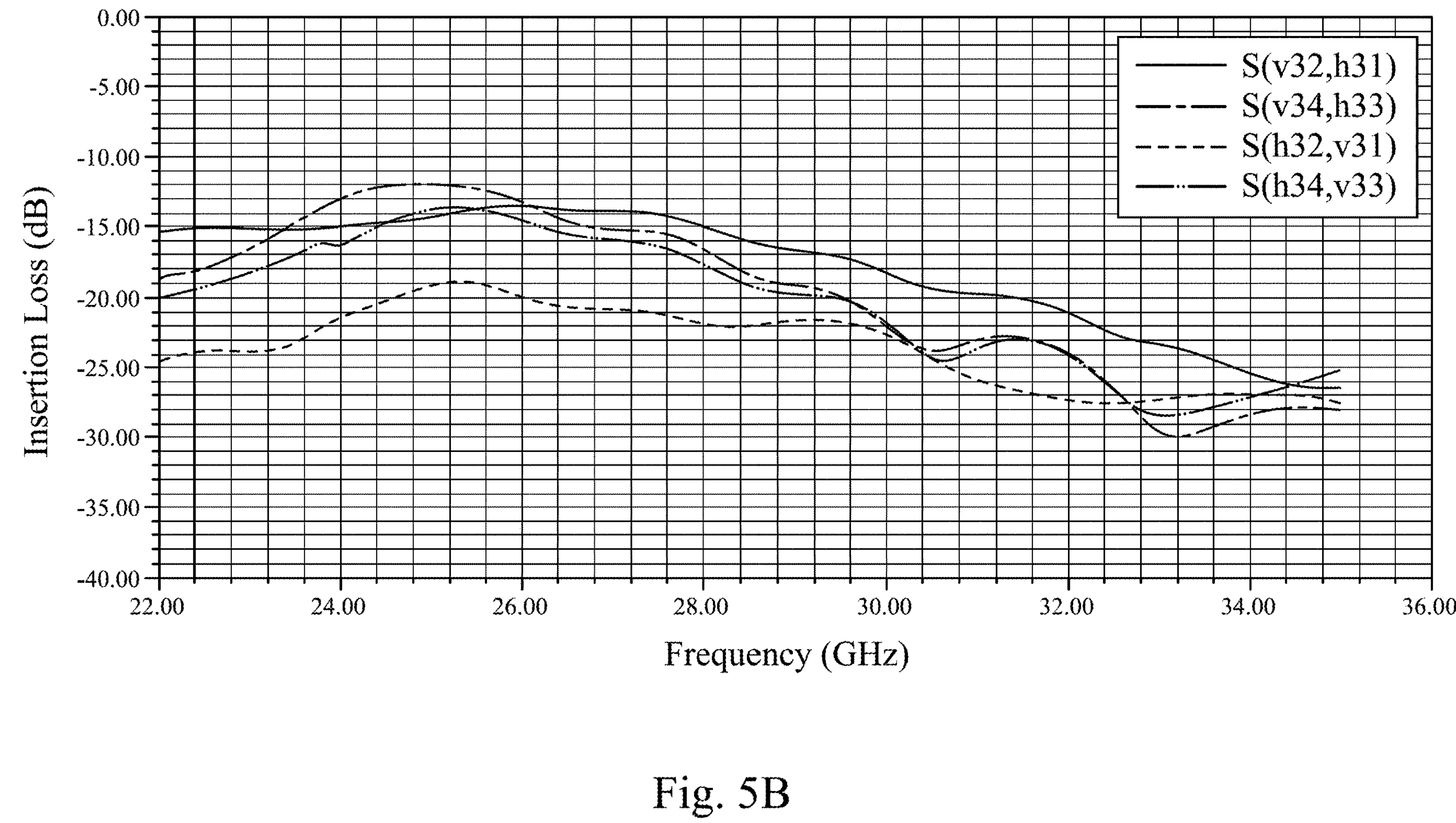
FIG. 5B is a schematic view of a comparison of a first received signal parameter with a first received signal standard range applying the test fixture set in FIG. 5A.

FIG. 5B is a schematic view of a comparison of a first received signal parameter with a first received signal standard range applying the test fixture set 500 in FIG. 5A. With reference to FIG. 4 to FIG. 5B, the first received signal parameter is specifically the insertion loss of the S parameter. The insertion loss of multiple signal paths in FIG. 5A can be used as the standard range of the insertion loss of another signal path. The data curve S(h32, v31) in FIG. 5B is significantly lower than other data curves by 5 dB to 8 dB in power. It can be determined that at least one of the first DUT vertical pin v91 and the second DUT horizontal pin h92 of the corresponding signal path has or may have a poor connection, e.g., an open circuit at the soldering point of the pin.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A test fixture set, configured for performing a test of a DUT (Device under Test), the DUT comprising a DUT circuit board, a first DUT antenna and a second DUT antenna, the DUT circuit board comprising a DUT antenna surface, the first DUT antenna and the second DUT antenna disposed on and electrically connected to the DUT antenna surface, and the test fixture set comprising:

a fixture circuit board comprising a fixture antenna surface, which has a normal direction and is configured to face the DUT antenna surface;

a first fixture antenna disposed on and electrically connected to the fixture antenna surface, wherein the first fixture antenna is configured to be aligned with the first DUT antenna along the normal direction, and there is a spacing between the first fixture antenna and the first DUT antenna; and a second fixture antenna disposed on and electrically connected to the fixture antenna surface, wherein the second fixture antenna is configured to be aligned with the second DUT antenna along the normal direction, and there is another spacing between the second fixture antenna and the second DUT antenna;

wherein the fixture circuit board or the DUT circuit board further comprises a circuit line, the test fixture set is configured for the first DUT antenna, the first fixture antenna, the second fixture antenna, the second DUT antenna and the circuit line to form a signal path for a RF (Radio Frequency) signal passing therethrough;

wherein each of the first DUT antenna, the second DUT antenna, the first fixture antenna and the second fixture antenna is a dielectric resonator antenna, the first DUT antenna comprises a first DUT vertical pin and a first DUT horizontal pin, the second DUT antenna comprises a second DUT vertical pin and a second DUT horizontal pin, the first fixture antenna comprises a first fixture vertical pin and a first fixture horizontal pin, and the second fixture antenna comprises a second fixture vertical pin and a second fixture horizontal pin.

2. The test fixture set of claim 1, wherein the fixture circuit board further comprises the circuit line, two ends of the circuit line are electrically connected to the first fixture vertical pin and the second fixture horizontal pin, respectively, and the signal path is formed by the first DUT vertical pin, the first fixture vertical pin, the circuit line, the second fixture horizontal pin and the second DUT horizontal pin electrically coupled in sequence.

3. The test fixture set of claim 2, wherein the DUT further comprises a RF controller, which is electrically connected to each of the first DUT vertical pin, the first DUT horizontal pin, the second DUT vertical pin and the second DUT horizontal pin;

wherein the RF controller is configured to generate the RF signal and transmits the RF signal to the first DUT vertical pin, then the RF signal passes through the signal path, and then the RF signal is transmitted from the second DUT horizontal pin to the RF controller for obtaining a received strength index; or the RF controller is configured to generate the RF signal and transmits the RF signal to the second DUT horizontal pin, then the RF signal passes through the signal path, and then the RF signal is transmitted from the first DUT vertical pin to the RF controller for obtaining the received strength index.

4. The test fixture set of claim 1, wherein the DUT circuit board further comprises the circuit line, two ends of the circuit line are electrically connected to the first DUT vertical pin and the second DUT horizontal pin, respectively, and the signal path is formed by the first fixture vertical pin, the first DUT vertical pin, the circuit line, the second DUT horizontal pin and the second fixture horizontal pin electrically coupled in sequence.

5. The test fixture set of claim 4, further comprising:

at least one RF test equipment able to be electrically connected to each of the first fixture vertical pin, the first fixture horizontal pin, the second fixture vertical pin and the second fixture horizontal pin;

wherein the at least one RF test equipment is configured to generate the RF signal and transmits the RF signal to the first fixture vertical pin, then the RF signal passes through the signal path, and then the RF signal is transmitted from the second fixture horizontal pin to the at least one RF test equipment for obtaining a received strength; or the at least one RF test equipment is configured to generate the RF signal and transmits the RF signal to the second fixture horizontal pin, then the RF signal passes through the signal path, and then the RF signal is transmitted from the first fixture vertical pin to the at least one RF test equipment for obtaining the received strength.

6. The test fixture set of claim 1, wherein the DUT further comprises a third DUT antenna, which is disposed on and electrically connected to the DUT antenna surface, and the test fixture set further comprises:

a third fixture antenna disposed on and electrically connected to the fixture antenna surface, wherein the third fixture antenna is configured to be aligned with the third DUT antenna along the normal direction, there is further another spacing between the third fixture antenna and the third DUT antenna, and the first fixture antenna, the third fixture antenna and the second fixture antenna are arranged in sequence;

wherein the first DUT antenna, the second DUT antenna and the third DUT antenna are the same and have an operating frequency between 20 GHz and 100 GHz, the first fixture antenna, the second fixture antenna and the third fixture antenna are the same and have an operating frequency between 20 GHz and 100 GHZ, and the spacing, the another spacing and the further another spacing are the same and are between 2 mm and 40 mm.

7. A testing method, comprising:

providing a DUT, which comprises a DUT circuit board, a first DUT antenna, a second DUT antenna and a RF controller, wherein the DUT circuit board comprises a DUT antenna surface, the first DUT antenna and the second DUT antenna are disposed on and electrically connected to the DUT antenna surface, each of the first DUT antenna and the second DUT antenna is a dielectric resonator antenna and comprises a first polarization pin and a second polarization pin, and the RF controller is disposed on and electrically connected to the DUT circuit board;

providing a test fixture set, which comprises a fixture circuit board, a first fixture antenna and a second fixture antenna, wherein the fixture circuit board comprises a fixture antenna surface and a circuit line, the fixture antenna surface has a normal direction and is configured to face the DUT antenna surface, the first fixture antenna and the second fixture antenna are disposed on and electrically connected to the fixture antenna surface, each of the first fixture antenna and the second fixture antenna is a dielectric resonator antenna and comprises a first polarization pin and a second polarization pin, two ends of the circuit line are electrically connected to the first polarization pin of the first fixture antenna and the second polarization pin of the second fixture antenna, respectively, the first fixture antenna and the first DUT antenna are aligned along the normal direction and have a spacing therebetween, and the second fixture antenna and the second DUT antenna are aligned along the normal direction and have another spacing therebetween;

causing the RF controller to generate a RF signal and transmit the RF signal to the first polarization pin of the first DUT antenna; and causing a part of the RF signal to pass through the first polarization pin of the first DUT antenna, the first polarization pin of the first fixture antenna, the circuit line, the second polarization pin of the second fixture antenna and the second polarization pin of the second DUT antenna in sequence to the RF controller, and obtaining a first received signal parameter.

8. The testing method of claim 7, further comprising:

causing another part of the RF signal to pass through the first polarization pin of the first DUT antenna and the second polarization pin of the first DUT antenna in sequence to the RF controller, and obtaining a second received signal parameter;

providing a first received signal standard range and a second received signal standard range;

comparing the first received signal parameter with the first received signal standard range, and comparing the second received signal parameter with the second received signal standard range; and determining whether at least one of the first polarization pin, the second polarization pin of the first DUT antenna and the second polarization pin of the second DUT antenna has a poor connection.

9. A testing method, comprising:

providing a DUT, which comprises a DUT circuit board, a first DUT antenna and a second DUT antenna, wherein the DUT circuit board comprises a DUT antenna surface and a circuit line, the first DUT antenna and the second DUT antenna are disposed on and electrically connected to the DUT antenna surface, each of the first DUT antenna and the second DUT antenna is a dielectric resonator antenna and comprises a first polarization pin and a second polarization pin, and two ends of the circuit line are electrically connected to the first polarization pin of the first DUT antenna and the second polarization pin of the second DUT antenna, respectively;

providing a test fixture set, which comprises a fixture circuit board, a first fixture antenna, a second fixture antenna and at least one RF test equipment, wherein the fixture circuit board comprises a fixture antenna surface having a normal direction and configured to face the DUT antenna surface, the first fixture antenna and the second fixture antenna are disposed on and electrically connected to the fixture antenna surface, each of the first fixture antenna and the second fixture antenna is a dielectric resonator antenna and comprises a first polarization pin and a second polarization pin, the first fixture antenna and the first DUT antenna are aligned along the normal direction and have a spacing therebetween, the second fixture antenna and the second DUT antenna are aligned along the normal direction and have another spacing therebetween, and the at least one RF test equipment is electrically connected to the first polarization pin of the first fixture antenna and the second polarization pin of the second fixture antenna;

causing the at least one RF test equipment to generate a RF signal and transmit the RF signal to the first polarization pin of the first fixture antenna; and causing the RF signal to pass through the first polarization pin of the first fixture antenna, the first polarization pin of the first DUT antenna, the circuit line, the second polarization pin of the second DUT antenna and the second polarization pin of the second fixture antenna in sequence to the at least one RF test equipment, and obtaining a first received signal parameter;

providing a first received signal standard range;

comparing the first received signal parameter with the first received signal standard range; and determining whether at least one of the first polarization pin of the first DUT antenna and the second polarization pin of the second DUT antenna has a poor connection.

* * * * *